United States Patent [19]
Ramdani et al.

[11] Patent Number: 5,943,359
[45] Date of Patent: Aug. 24, 1999

[54] LONG WAVELENGTH VCSEL

[75] Inventors: Jamal Ramdani, Gilbert; Michael S. Lebby, Apache Junction; Wenbin Jiang, Phoenix, all of Ariz.

[73] Assignee: Motorola, Inc., Schaumburg, Ill.

[21] Appl. No.: 08/839,112

[22] Filed: Apr. 23, 1997

[51] Int. Cl.$^6$ ........................................................ H01S 3/19
[52] U.S. Cl. ................................ 372/96; 372/45; 372/46; 257/88
[58] Field of Search ................................ 372/45, 46, 50, 372/96; 257/88

[56] References Cited

U.S. PATENT DOCUMENTS

| | | | |
|---|---|---|---|
| 5,146,465 | 9/1992 | Khan et al. | 372/45 |
| 5,383,211 | 1/1995 | Van de Walle et al. | 372/43 |
| 5,432,809 | 7/1995 | Grodzinski et al. | 372/50 |
| 5,642,376 | 6/1997 | Olbright et al. | 372/50 |
| 5,708,280 | 1/1998 | Lebby et al. | 257/88 |
| 5,719,895 | 2/1998 | Jewell et al. | 372/50 |

FOREIGN PATENT DOCUMENTS 0723303  7/1996  European Pat. Off. ........ H01L 33/00

OTHER PUBLICATIONS

T. Miyamoto et al. "Design and Expected Characteristics of 1.2 mum GaInNas/GaAs Vertical Cavity Surface Emitting Lasers" Quantum Optoelectronics 1997, Technical Digest Series, Postconference Edition, vol. 9, Mar. 19–21, 1997, pp. 126–128.

M. Kondow et al. "A Novel Material of GaInNAs for Long–Wavelength–Range Laser Diodes with Excellent High–Temperature Performance" International Conference on Solid State Devices and Materials, Aug. 21, 1995, pp. 1016–1018.

Primary Examiner—Rodney Bovernick
Assistant Examiner—Yisun Song
Attorney, Agent, or Firm—Eugene A. Parsons; William E. Koch

[57] ABSTRACT

A VCSEL for emitting long wavelength light including a GaAs (111) substrate element, a first mirror stack with mirror pairs in a GaAs/AlGaAs material system lattice matched to a GaInAsN active region with an active structure sandwiched between a first cladding region adjacent the first mirror stack and a second cladding region, the active structure including a nitride based quantum well, and a second mirror stack lattice matched to the second cladding region and having mirror pairs in a GaAs/AlGaAs material system.

15 Claims, 1 Drawing Sheet

LONG WAVELENGTH VCSEL

FIELD OF THE INVENTION

This invention relates to vertical cavity surface emitting lasers and more specifically to vertical cavity surface emitting lasers for emitting long wavelength light.

BACKGROUND OF THE INVENTION

Vertical cavity surface emitting lasers (VCSEL) include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by a current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs/GaAs or AlGaAs/AlAs material system wherein the different refractive index of each layer of a pair is achieved by altering the aluminum content in the layers. In conventional devices, the number of mirror pairs per stack may range from 20–40 to achieve a high percentage of reflectivity, depending on the difference between the refractive indices of the layers. The large number of pairs increases the percentage of reflected light.

In conventional VCSELs, conventional material systems perform adequately. However, new products are being developed requiring VCSELs which emit light having long wavelengths. VCSELs emitting light having a long wavelength are of great interest in the optical telecommunication industry. As an example, a long wavelength VCSEL can be obtained by using a VCSEL having an InP active region. When an InP active region is used, an InP/InGaAsP material system must be used for the mirror stacks in order to achieve a lattice match. In this system, however, it is practically impossible to achieve decent DBR based mirrors because of the insignificant difference in the refractive indices in this material system. Many attempts have been made to address this problem including a wafer bonding technique in which a DBR mirror is grown on a separate substrate and bonded to the active region. This technique has had only limited success and also the interface defects density in the wafer fusion procedure causes potential reliability problems.

It would be highly advantageous, therefore, to remedy the foregoing and other deficiencies inherent in the prior art.

Accordingly, it is an object of the present invention to provide a new and improved long wavelength VCSEL.

Another object of the invention is to provide a reliable long wavelength VCSEL.

Still another object of the immediate invention is to provide an efficient active region and mirror stacks for use in a long wavelength VCSEL.

Yet another object of the invention is to reduce the complexity of fabricating a long wavelength VCSEL.

Another object of the present invention is to provide an active region which emits long wavelength light and a mirror stack which can be lattice matched thereto.

SUMMARY OF THE INVENTION

Briefly, to achieve the desired objects of the instant invention in accordance with a preferred embodiment thereof, provided is a VCSEL for emitting long wavelength light. The VCSEL includes a GaAs (111) substrate element, a first mirror stack disposed on the substrate element, a GaInAsN active region including a nitride based quantum well, the active region being disposed on the first mirror stack, and a second mirror stack disposed on the active region.

In a preferred embodiment the active region and the first and the second mirror stacks are configured to emit light with a wavelength in a range of approximately 1.3–1.55 micrometers. The quantum well is configured with a direct energy band-gap in a range of approximately 1.42–0.7 eV.

Also provided is a method of fabricating a VCSEL for emitting long wavelength light. The method includes providing a GaAs (111) substrate having a surface, epitaxially growing a first mirror stack on the surface, epitaxially growing a GaInAsN active region including a nitride based quantum well on the first mirror stack, and epitaxially growing a second mirror stack on the active region.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
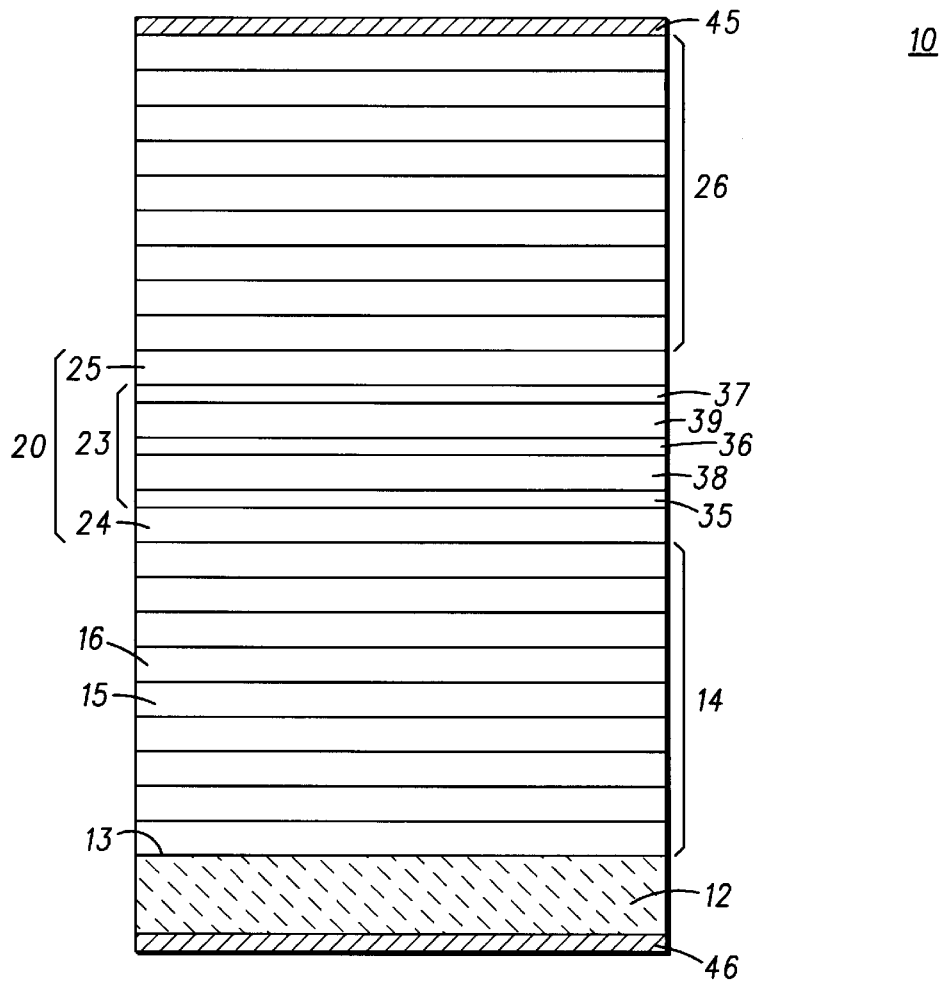
FIG. 1 is a sectional view of a VCSEL in accordance with the present invention.

Turning now to the drawings in which like reference characters indicate corresponding elements throughout the several views, attention is first directed to FIG. 1 which illustrates a long wavelength vertical cavity surface emitting laser (VCSEL) generally designated 10. VCSEL 10 is formed on a substrate 12, which in this specific embodiment, is GaAs (111). GaAs (111) is used to facilitate epitaxial growth of the components of VCSEL 10 which emits light in a long wavelengths approximately in the range of 1.3 μm–1.55 μm. It should be understood that GaAs (111) is further employed as substrate 12 in that the (111) surface crystal orientation will allow for longer wavelength continuous wave (CW) operation at normal operating temperatures. In addition, the use of a (111) oriented substrate will allow for the extension of an emitted wavelength up to 1.1 μm, which is extremely hard to achieve on a (100) substrate surface crystal orientation.

Figure 2:
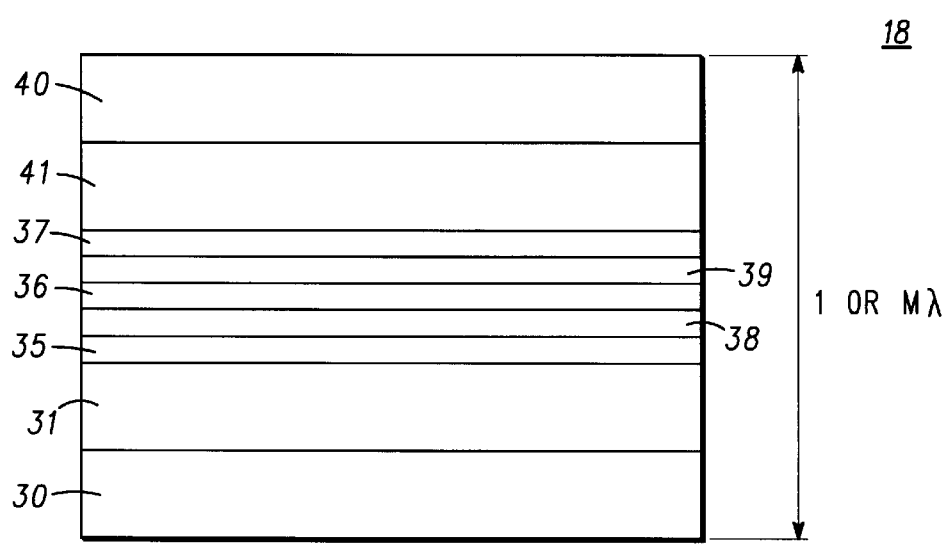
FIG. 2 is a sectional view of the active region of the VCSEL of FIG. 1 in accordance with the present invention.

Substrate 12 has an upper surface 13 on which a mirror stack 14 is disposed. Mirror stack 14 includes a plurality of mirror pairs in a GaAs/AlGaAs material system. An active region 20 is disposed on mirror stack 14. Active region 20, as further detailed in FIG. 2, includes an active structure 23 sandwiched between a first cladding region 24 adjacent first mirror stack 14 and a second cladding region 25. A second mirror stack 26 is disposed on second cladding region 25 and includes mirror pairs in a GaAs/AlGaAs material system.

Mirror stack 14 is grown by epitaxially depositing pairs of layers on substrate 12. In order to crystal lattice match mirror stack 14 to substrate 12 a suitable semiconductor material system must be deposited. In this specific example, substrate 12 is GaAs (111) and, therefore, a GaAs/AlGaAs material system is employed. Approximately 20–40 mirror pairs of this material system are deposited on substrate 12 depending on the difference between the refractive indices of the layers. The different refractive index the layers of each pair is achieved by altering the aluminum content. In this specific embodiment, a GaAl$_{0.7}$As layer and a GaAs layer forming a mirror pair is preferred. The large number of pairs increases the percentage of reflected light.

Referring again to FIGS. 1 and 2, cladding region 24 includes one or more layers which may be graded if necessary for more efficient carrier confinement in active structure 23. In this specific embodiment, cladding region 24 is formed of a GaAs material system. For example cladding region 24 includes a first layer 30 formed of GaAs to lattice match mirror stack 14, and a second layer 31 formed of a material having a gradient to efficiently confine the carriers in active structure 23.

Active structure 23, in this embodiment, includes three nitride based quantum well layers 35, 36, and 37, separated by barrier layers 38 and 39. For example quantum well layers 35, 36, and 37 and barrier layers 38 and 39 are each approximately 100 Å and the total thickness of active region 20 is approximately one wavelength of the emitted light or a multiple thereof. Quantum well layers 35, 36, and 37 are formed of $Ga_{1-y}In_yAs_{1-x}(N)_x$. One skilled in the art will understand that more or fewer quantum well layers and barrier layers can be used depending upon the application. Active region 20 and first and second mirror stacks 14 and 26 respectively are configured to emit light with a wavelength in a range of approximately 1.3–1.55 micrometers. To achieve this range the quantum wells are configured with a direct energy band-gap in a range of approximately 1.42 eV with y=0 to 0.7 eV with y=0.3. The mole fraction of Indium (0–30%) is higher than that required when the VCSEL structure is grown on a (100) orientation substrate element. In that the incorporation of a nitride based quantum well active region is difficult at low growth temperatures, the use of the GaAs (111) substrate further facilitates the achievement of 1.3 μm operation by adding a small fraction of Nitrogen to the InGaAs. This fraction is much lower than the one required for the GaAs (100).

Cladding region 25 includes one or more layers which may be graded if necessary for more efficient carrier confinement in active structure 23. In this specific embodiment, cladding region 25 is formed of a GaAs material system. For example cladding region 25 includes a first layer 40 formed of GaAs to lattice match mirror stack 26, and a second layer 41 formed of a material having a gradient to more efficiently confine carriers in active structure 23.

Mirror stack 26 is grown by epitaxially depositing pairs of layers on cladding region 25. In order to crystal lattice match mirror stack 26 to active structure 23, a suitable semiconductor material system must be deposited. In this specific example, cladding region 25 is GaAs based and, therefore, a GaAs/AlGaAs material system is employed. Approximately 20–40 mirror pairs of this material system are deposited on cladding region 25 depending on the difference between the refractive indices of the layers. The different refractive index the layers of each pair is achieved by altering the aluminum content. In this specific embodiment, a GaAl$_{0.7}$As layer and a GaAs layer forming a mirror pair is preferred. The large number of pairs increases the percentage of reflected light.

To complete VCSEL 10, a contact layer 45 is positioned on mirror stack 26, and a contact layer 46 is positioned on substrate 12, for example on the rear surface thereof. As will be understood by those skilled in the art contact 45 is so constructed as to permit the emission of light from VCSEL 10.

Various changes and modifications to the embodiments herein chosen for purposes of illustration will readily occur to those skilled in the art. For example, it should be understood that VCSEL structure symmetry exists for both the p and n dopants as well as electrically inverted structure designs. To the extent that such modifications and variations do not depart from the spirit of the invention, they are intended to be included within the scope thereof which is assessed only by a fair interpretation of the following claims.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A vertical cavity surface emitting laser for emitting long wavelength light, the vertical cavity surface emitting laser comprising:
   a GaAs (111) substrate;
   a first mirror stack disposed on the GaAs (111) substrate;
   a GaInAsN active region including a nitride based quantum well, a first graded cladding region including a GaAs/AlGaAs material system and a second graded cladding region including a GaAs/AlGaAs material system, the active region being disposed on the first mirror stack; and
   a second mirror stack disposed on the active region.

2. A vertical cavity surface emitting laser as claimed in claim 1 wherein the active region and the first and the second mirror stacks are configured to emit light with a wavelength in a range of approximately 1.3–1.55 micrometers.

3. A vertical cavity surface emitting laser as claimed in claim 1 wherein the nitride based quantum well is configured with a direct energy band-gap in a range of approximately 1.42–0.7 eV.

4. A vertical cavity surface emitting laser as claimed in claim 1 wherein the nitride based quantum well includes $Ga_{1-y}In_yAs_{1-x}(N)_x$, wherein x has a range of 0.001–0.1 and y has a range of 0–0.3.

5. A vertical cavity surface emitting laser as claimed in claim 4 wherein the nitride based quantum well includes $Ga_{0.7}In_{0.3}As_{1-x}N_x$.

6. A vertical cavity surface emitting laser for emitting long wavelength light, the vertical cavity surface emitting laser comprising:
   a GaAs (111) substrate;
   a first mirror stack including mirror pairs in a GaAs/AlGaAs material system adjacent the GaAs (111) substrate;
   a GaInAsN active region including an active structure sandwiched between a first cladding region including a GaAs/AlGaAs material system adjacent the first mirror stack and a second cladding region including a GaAs/AlGaAs material system, the active structure including a nitride based quantum well; and
   a second mirror stack disposed on the second cladding region and including mirror pairs in a GaAs/AlGaAs material system.

7. A vertical cavity surface emitting laser as claimed in claim 6 wherein the first cladding region is graded to more efficiently confine carriers in the active structure.

8. A vertical cavity surface emitting laser as claimed in claim 6 wherein the active region and the first and the second mirror stacks are configured to emit light with a wavelength in a range of approximately 1.3–1.55 micrometers.

9. A vertical cavity surface emitting laser as claimed in claim 6 wherein the nitride based quantum well is configured with a direct energy band-gap in a range of approximately 1.42–0.7 eV.

10. A vertical cavity surface emitting laser as claimed in claim 9 wherein the nitride based quantum well includes $Ga_{1-y}In_yAs_{1-x}(N)_x$, wherein x has a range of 0.001–0.1 and y has a range of 0–0.3.

11. A vertical cavity surface emitting laser as claimed in claim 10 wherein the nitride based quantum well includes $Ga_{0.7}In_{0.3}As_{1-x}N_x$.

12. A method of fabricating a vertical cavity surface emitting laser for emitting long wavelength light, the method comprising the steps of:

providing a GaAs (111) substrate having a surface;

epitaxially growing a first mirror stack on the surface;

epitaxially growing a GaInAsN active region including a nitride based quantum well, a first graded cladding region including a GaAs/AlGaAs material system and a second graded cladding region including a GaAs/AlGaAs material system on the first mirror stack; and epitaxially growing a second mirror stack on the active region.

13. A method of fabricating a vertical cavity surface emitting laser for emitting long wavelength light as claimed in claim 12 wherein the step of epitaxially growing a GaInAs active region includes epitaxially growing the nitride based quantum well including $Ga_{1-y}In_yAs_{1-x}(N)_x$, wherein x has a range of 0.001–0.1 and y has a range of 0–0.3.

14. A method of fabricating a vertical cavity surface emitting laser for emitting long wavelength light, the method comprising the steps of:

providing a GaAs (111) substrate having a surface;

epitaxially growing a first plurality of mirror pairs in a GaAs/AlGaAs material system forming a first mirror stack on the surface, lattice matched to the substrate;

epitaxially growing a GaInAs active region including an active structure sandwiched between a first cladding region lattice matched to the first mirror stack and including a GaAs/AlGaAs material system and a second cladding region including a GaAs/AlGaAs material system, and forming the active structure to include a nitride based quantum well; and epitaxially growing a second plurality of mirror pairs in a GaAs/AlGaAs material system forming a second mirror stack lattice matched to the second cladding region.

15. A method of fabricating a vertical cavity surface emitting laser for emitting long wavelength light as claimed in claim 14 wherein the step of epitaxially growing a GaInAs active region includes epitaxially growing the nitride based quantum well including $Ga_{1-y}In_yAs_{1-x}(N)_x$, wherein x has a range of 0.001–0.1 and y has a range of 0–0.3.

* * * * *